(12) United States Patent
Pei

(10) Patent No.: US 8,500,977 B2
(45) Date of Patent: *Aug. 6, 2013

(54) COATING APPARATUS

(75) Inventor: Shao-Kai Pei, Tu-Cheng (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 428 days.

This patent is subject to a terminal disclaimer.

(21) Appl. No.: 12/770,753

(22) Filed: Apr. 30, 2010

(65) Prior Publication Data

US 2011/0073472 A1    Mar. 31, 2011

(30) Foreign Application Priority Data

Sep. 30, 2009   (CN) .......................... 2009 1 0308028

(51) Int. Cl.
| | |
|---|---|
| *C25B 9/00* | (2006.01) |
| *C25B 11/00* | (2006.01) |
| *C25B 13/00* | (2006.01) |
| *C23C 14/00* | (2006.01) |
| *C23C 16/00* | (2006.01) |
| *C23C 16/50* | (2006.01) |

(52) U.S. Cl.
USPC ............ 204/298.26; 204/298.23; 204/298.25; 204/298.28; 204/298.41; 118/720; 118/723 VE; 118/723 CB; 118/723 EB; 118/726; 118/729; 118/730

(58) Field of Classification Search
USPC ............. 118/719, 723 EV, 723 EB, 729, 730, 118/731, 720, 723 VE, 723 CB, 726; 204/298.26, 298.27, 298.28, 298.29, 298.41, 204/298.23, 298.25

See application file for complete search history.

(56) References Cited

U.S. PATENT DOCUMENTS

| | | | | | |
|---|---|---|---|---|---|
| 4,867,859 | A | * | 9/1989 | Harada et al. ............ | 204/298.04 |
| 4,877,505 | A | * | 10/1989 | Bergmann ............... | 204/192.38 |
| 4,992,153 | A | * | 2/1991 | Bergmann et al. ....... | 204/192.16 |
| 5,503,725 | A | * | 4/1996 | Sablev et al. ............ | 204/192.12 |
| 5,514,260 | A | * | 5/1996 | Seo .......................... | 204/298.26 |
| 6,494,997 | B1 | * | 12/2002 | Israel et al. .............. | 204/192.12 |
| 7,300,559 | B2 | * | 11/2007 | Gorokhovsky .......... | 204/192.38 |
| 2011/0253531 | A1 | * | 10/2011 | Pei .......................... | 204/298.15 |

* cited by examiner

*Primary Examiner* — Michael Band
(74) *Attorney, Agent, or Firm* — Altis Law Group, Inc.

(57) ABSTRACT

A coating apparatus includes a housing, a sputter mechanism, an evaporation mechanism, and a workpiece transport assembly. The housing defines a receiving space. The workpiece transport assembly includes a fixing plate, a first transport member, and a first shaft. The fixing plate is secured to the housing via the receiving space and divides the receiving space into a sputter chamber and an evaporation chamber. The sputter mechanism is mounted in the sputter chamber, and the evaporation mechanism is mounted in the evaporation chamber. The fixing plate defines a through hole. The sputter chamber communicates with the evaporation chamber via the through hole. The first transport member is configured to transport at least one workpiece. The first shaft is secured to the first transport member and rotatably mounted to the housing.

12 Claims, 6 Drawing Sheets

COATING APPARATUS

BACKGROUND

1. Technical Field

The present disclosure relates to coating apparatuses and, particularly, to a coating apparatus for multi-layer coating.

2. Description of Related Art

It is common to use more than one kind of coating process, such as, spraying, ion sputtering, vapor deposition, or spray pyrolysis when applying multiple coats of materials such as paint or primer to a workpiece. Generally, each coating process must be carried out within a different vacuum chamber. To complete these multiple coating processes, the workpiece must be transported from one vacuum chamber to another. However, during the transportation, the workpiece may be exposed to the environment and may be contaminated.

BRIEF DESCRIPTION OF THE DRAWINGS

The components of the drawings are not necessarily drawn to scale, the emphasis instead being placed upon clearly illustrating the principles of a coating apparatus. Moreover, in the drawings, like reference numerals designate corresponding parts throughout several views.

DETAILED DESCRIPTION

Figure 1:
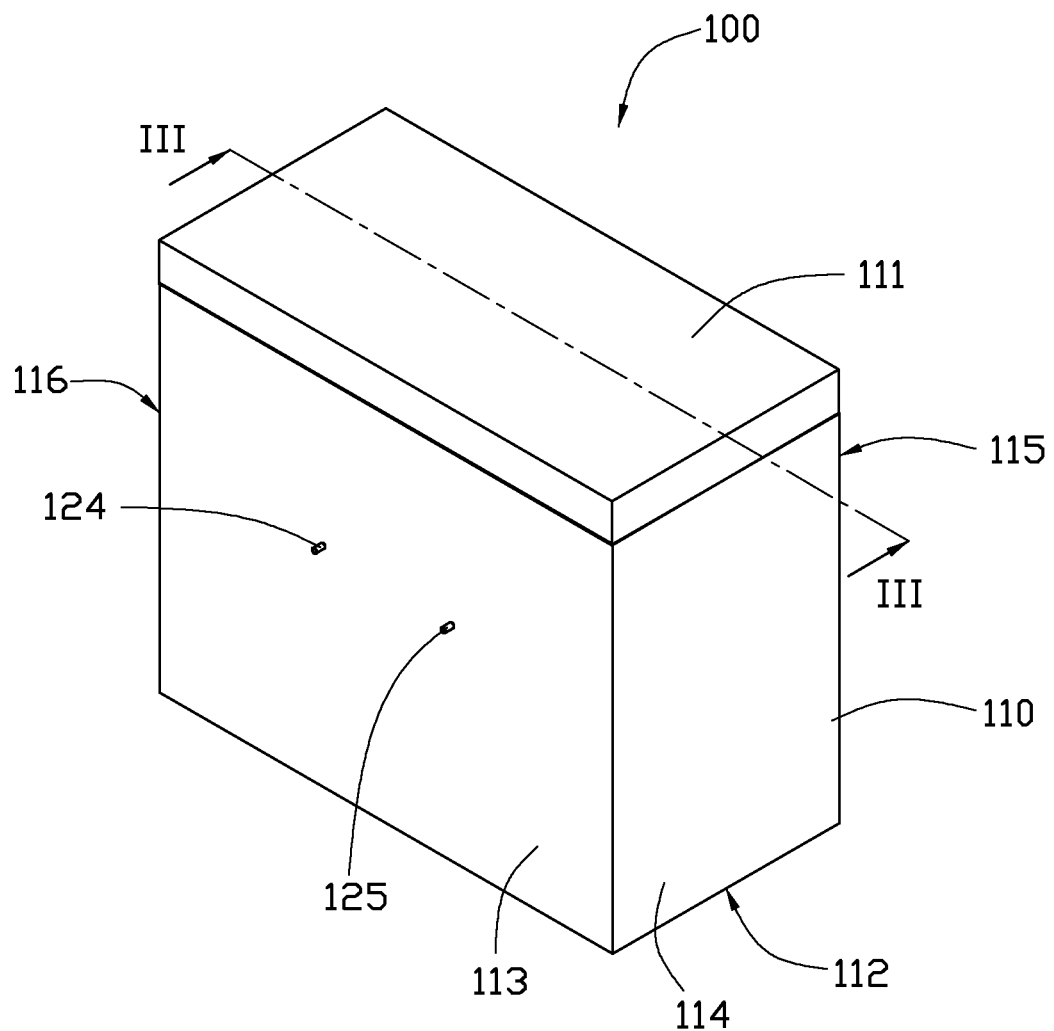
FIG. 1 is an isometric view of a coating apparatus in accordance with an exemplary embodiment.
Figure 2:
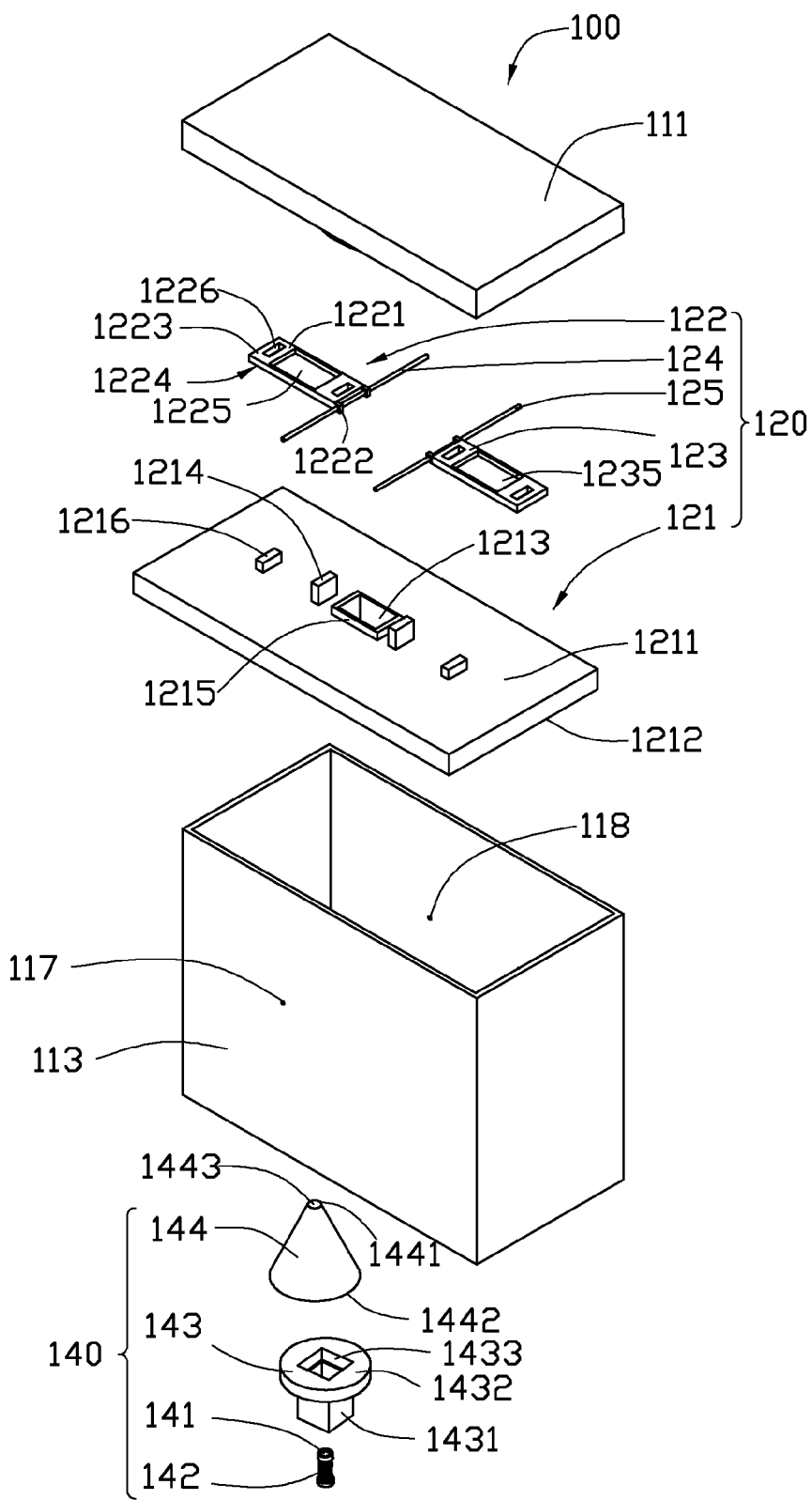
FIG. 2 is an exploded, perspective view of the coating apparatus of FIG. 1.
Figure 3:
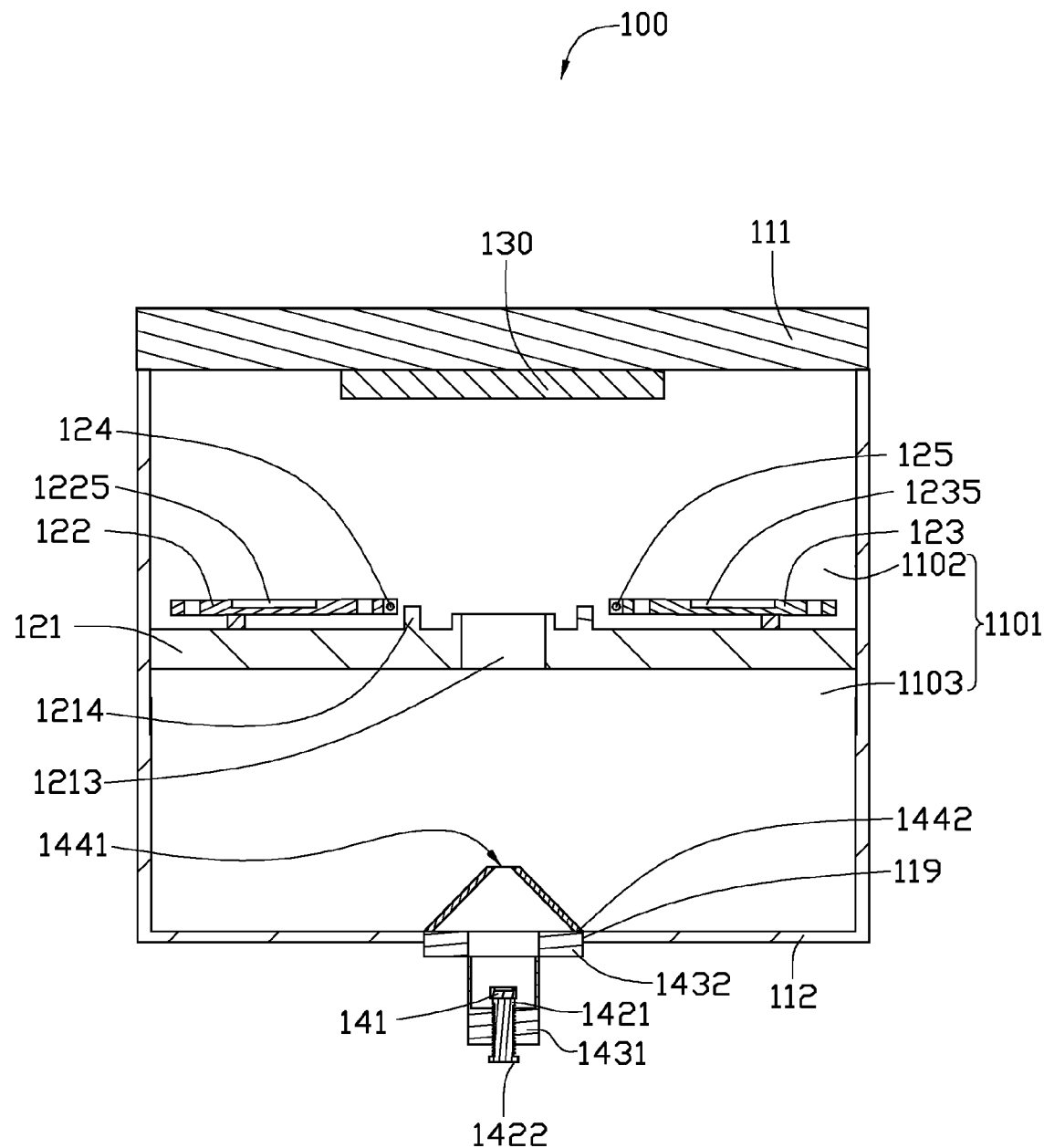
FIG. 3 is a cross-sectional view of the coating apparatus of FIG. 1, taken along line III-III.

Referring to FIGS. 1-3, an embodiment of a coating apparatus 100 is illustrated. The coating apparatus 100 includes a housing 110, a workpiece transport assembly 120, a sputter mechanism 130, and an evaporation mechanism 140. The housing 110 defines a receiving space 1101. The workpiece transport assembly 120 is configured to transport one or more workpieces (not shown). The workpiece transport assembly 120 is secured to the inner surface of the receiving space 1101 and divides the receiving space 1101 into a sputter chamber 1102 and an evaporation chamber 1103. The sputter mechanism 130 is mounted in the sputter chamber 1103 to implement a sputter coating process. The evaporation mechanism 140 is mounted in the evaporation chamber 1103 to implement an evaporation coating process.

The housing 110 includes a top plate 111, a bottom plate 112, a first sidewall 113, a second sidewall 114, a third sidewall 115, and a fourth sidewall 116, which cooperatively form the receiving space 1101. In the embodiment, the first sidewall 113 is parallel to the third sidewall 115, and the second sidewall 114 is parallel to the fourth sidewall 116. The sidewalls 113, 114, 115, and 116 are perpendicularly secured to the top plate 111 and the bottom plate 112. The first sidewall 113 defines a pair of first shaft holes 117 extending through the first sidewall 113. The distance between the top plate 112 and one of the first shaft holes 117 is about equal to the distance between the top plate 112 and the other first shaft hole 117. The third sidewall 115 defines a pair of second shaft holes 118, each of which is aligned with one of the first shaft holes 117. The bottom plate 112 defines a fixing hole 119 to receive the evaporation mechanism 140.

The workpiece transport assembly 120 includes a fixing plate 121, a first transport member 122, a second transport member 123, a first shaft 124, and a second shaft 125. In an alternative embodiment, the second transport member 123 and the second shaft 125 are absent from the workpiece transport assembly 120.

Figure 6:
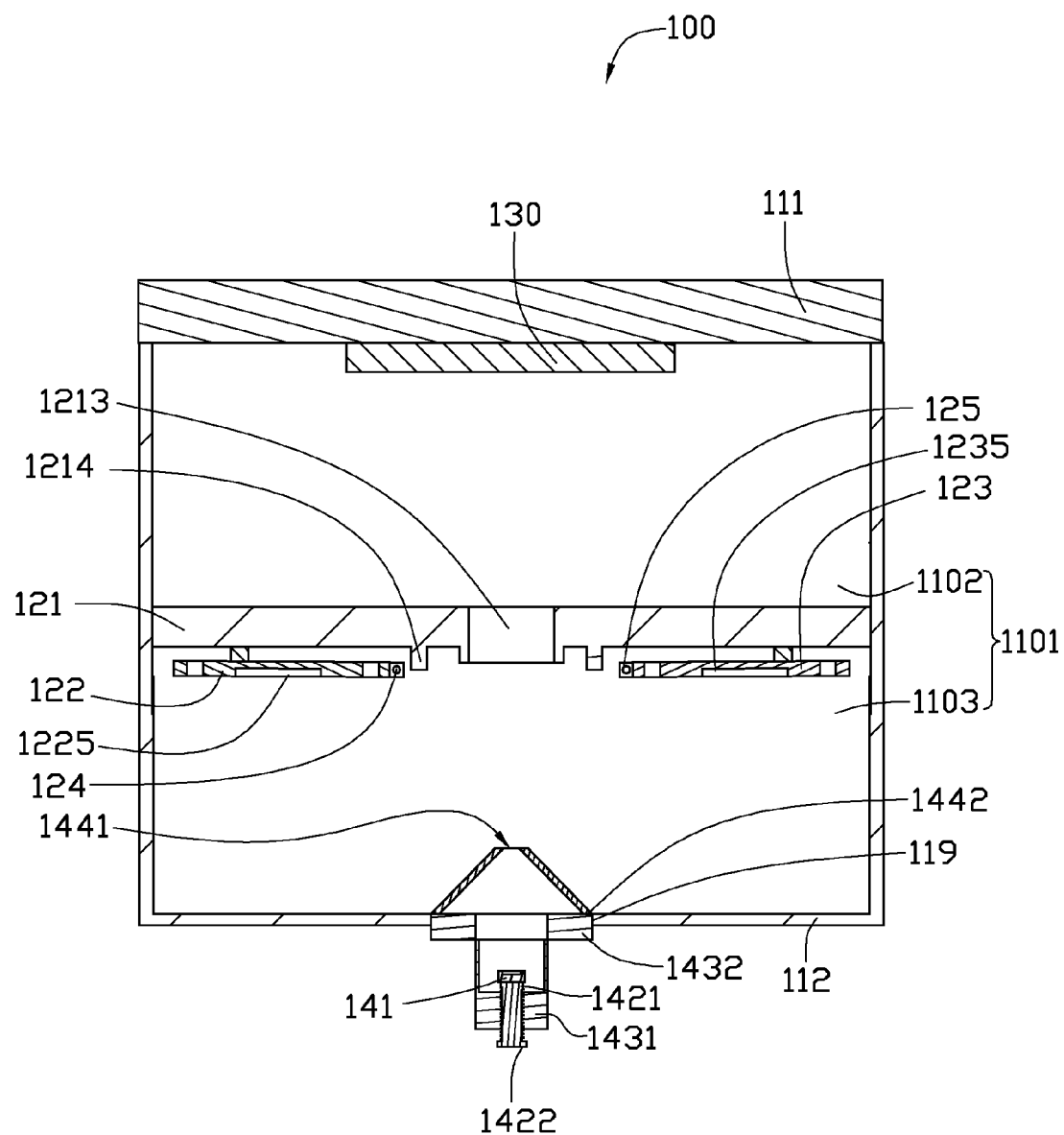
FIG. 6 is similar to FIG. 3, but showing a first transport member and a second transport member of the coating apparatus of FIG. 1 in an evaporation chamber.

The fixing plate 121 is perpendicularly secured to the sidewalls 113, 114, 115, and 116 and divides the receiving space 1101 into the sputter chamber 1102 and the evaporation chamber 1103. In the embodiment, the shaft holes 117 and 118 are in the sputter chamber 1102. In an alternative embodiment, the shaft holes 117 and 118 can be in the evaporation chamber 1103 (see FIG. 6). The fixing plate 121 includes a first surface 1211 and a second surface 1212 opposite to the first surface 1211. The fixing plate 1211 defines a through hole 1213 extending through the first surface 1211 and the second surface 1212. A supporting portion 1215 protrudes from the first surface 1211 and surrounds the through hole 1213 to support the first transport member 122 and the second transport member 123. A pair of positioning blocks 1214 and projections 1216 protrude from the first surface 1211. The through hole 1213 is arranged between the positioning blocks 1214, and the positioning blocks 1214 are arranged between the projections 1216. The height of the supporting portion 1215 is less than that of the positioning blocks 1214, and is generally equal to that of the projections 1216. The projections 1216 are configured to support the first transport member 122 and the second transport member 123, respectively.

The first transport member 122 and the second transport member 123 are used to transport the workpieces. The first transport member 122 includes a transport plate 1221 and a pair of connecting portions 1222 protruding from one end of the transport plate 1221. The first shaft 124 is secured to the first transport member 122 by the connecting portions 1222. The transport plate 1221 includes a first surface 1223 and a second surface 1224 opposite to the first surface 1223. The first surface 1223 defines a first cavity 1225 to receive one workpiece. The shape of the first cavity 1225 is the same as the through hole 1213. The transport plate 1221 defines a pair of first positioning holes 1226 extending through the first surface 1223 and the second surface 1224. The first cavity 1225 is arranged between the positioning holes 1226. The distance between the positioning holes 1226 is equal to the distance between the positioning blocks 1214. The distance between the center of the first cavity 1225 and the center of the one of the positioning holes 1226 is equal to the distance between the center of the through hole 1213 and one of the positioning blocks 1214. The structure of the second transport member 123 is the same as the first transport member 122. The second transport member 123 defines a second cavity 1235. The second shaft 125 is secured to the second transport member 123.

The first shaft 124 and the second shaft 125 are generally cylindrical. The length of the first shaft 124 and the second shaft 125 is greater than the distance between the first sidewall 113 and the third sidewall 115. The first shaft 124 passes through one of the first shaft holes 117 and one of the second shaft holes 118 to rotatably connect the first transport member 122 to the housing 110. The second shaft 125 passes through the other first shaft hole 117 and the other second shaft hole 118 to rotatably connect the second transport member 123 to the housing 110. As the length of the first shaft 124 and the second shaft 125 is greater than the distance between the first sidewall 113 and the third sidewall 115, at least one end of the first shaft 124 and the second shaft 125 are external to the housing 110. An operator can thus rotate the first shaft 124 and the second shaft 125 by the exposed ends.

In the embodiment, after assembly, the first cavity 1225 and the second cavity 1235 face the sputter chamber 1102. In an alternative embodiment, after assembly, the first cavity 1225 and the second cavity 1235 face the evaporation mechanism 140 (see FIG. 6).

Figure 4:
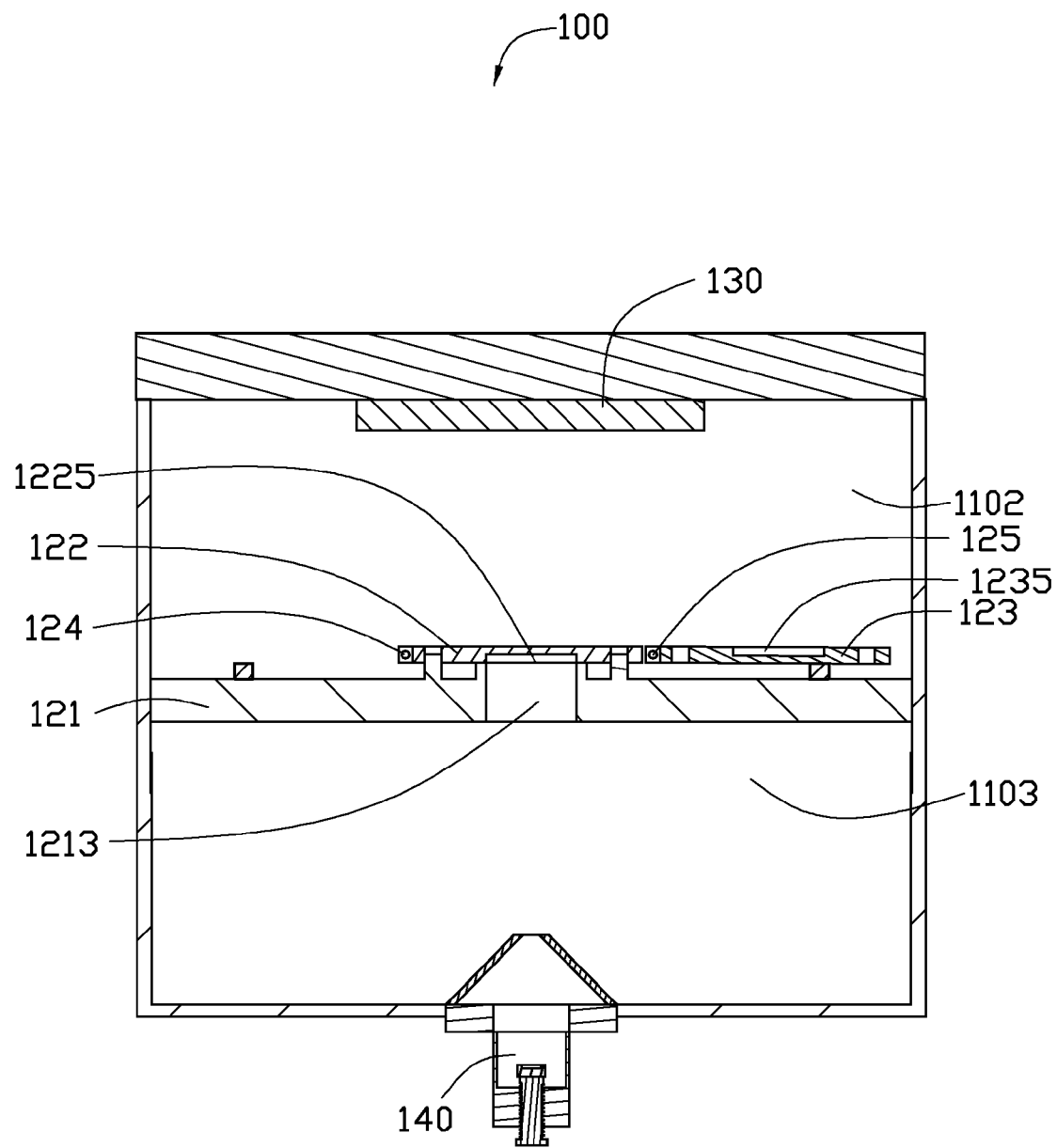
FIG. 4 is similar to FIG. 3, but showing the coating apparatus in a first state.

Referring also to FIG. 4, in operation, the first shaft 124 is rotated to cause the positioning blocks 1214 to pass through the first positioning holes 1226, respectively, and the cavity 1225 of the first transport member 122 faces the through hole 1213. The sputter mechanism 130 and the evaporation mechanism 140 are activated. A first sputter coating process is implemented in the sputter chamber 1102 and a first evaporation coating process is implemented in the evaporation chamber 1103, thus the workpiece in the first transport member 122 is coated with an evaporation layer, and the workpiece in the second transport member 123 is coated with a sputter layer.

Figure 5:
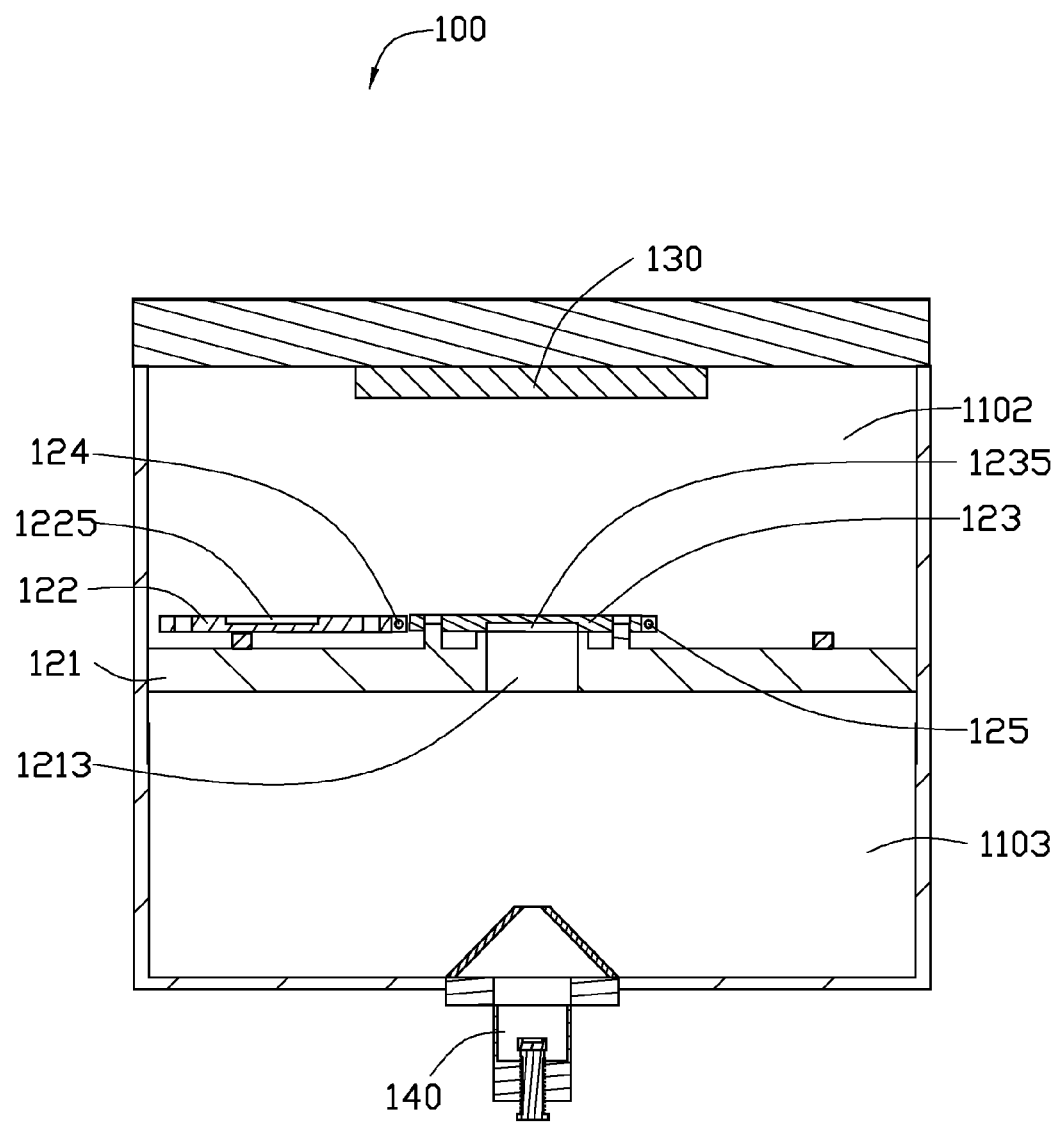
FIG. 5 is similar to FIG. 3, but showing the coating apparatus in a second state.

Referring also to FIG. 5, after the first sputter coating process and the first evaporation process are completed, the first shaft 124 is rotated to cause the cavity 1225 to face the sputter chamber 1102, and the second shaft 125 is rotated to cause the cavity 1235 to face the through hole 1213. The sputter mechanism 130 and the evaporation mechanism 140 are activated. A second sputter coating process is implemented in the sputter chamber 1102 and a second evaporation coating process is implemented in the evaporation chamber 1103, thus the workpiece in the first transport member 122 is coated with a sputter layer, and the workpiece in the second transport member 123 is coated with an evaporation layer.

With such configuration, the workpieces can be coated with multi-layers without exposed to the environment. Contaminations to the workpieces can thus be avoided.

The following description is employed to describe the detail structure of the sputter mechanism 130 and the evaporation mechanism 140.

The sputter mechanism 130 is mounted on the inner surface of the top plate 111. The sputter mechanism 130 includes a sputter target (not shown). The sputter chamber 1102 is filled with inertial gas. When a high voltage electrical field is applied, the inertia gas is ionized, generating positively charged particles and negatively charged particles. The positively charged particles bombard the sputter target due to the electrical field, which generates neutral atoms. The atoms are spattered to the workpiece, thus the sputter coating layer is formed on the workpiece.

The evaporation mechanism includes an evaporation pot 141, a first fixing member 142, a second fixing member 143, and a sprayer 144. The pot 141 is configured to receive coating material. The first fixing member 142 is generally cylindrical. The first fixing member 142 includes a first end 1421 and a second fixing end 1422 opposite to the first end 1421. The pot 141 is secured to the first end 1421. The second fixing member 143 includes a first fixing portion 1431 and a second fixing portion 1432 secured to the first fixing portion 1431. The second fixing portion 1432 is mounted in the fixing hole 119. The second fixing member 143 defines a receiving hole 1433 extending through the first fixing portion 1431 and the second fixing portion 1432. The first fixing member 142 engages the second fixing member 143. The pot 141 is received in the receiving hole 1433, and the second end 1422 of the first fixing member 142 is external to the second fixing member 143.

The sprayer 144 is mounted on the second fixing portion 1432 and received in the evaporation chamber 1103. The sprayer 144 is hollow and frustum shaped. The sprayer 144 includes a top surface 1441 and a bottom surface 1442. The bottom surface 1442 is secured to the bottom plate 112. An opening 1443 is formed in the top surface 1441. The distance between the outer surface of the sprayer 144 and the axis of the sprayer 144 gradually increases from the top surface 1441 to the bottom surface 1442.

In operation, the evaporation material in the pot 141 is sprayed to the sprayer 144. When the concentration of the evaporation material in the sprayer 144 reaches a predetermined value, the evaporation material is sprayed to the workpiece, thus the evaporation coating layer is formed in the workpiece.

Although the present disclosure has been specifically described on the basis of the exemplary embodiment thereof, the disclosure is not to be construed as being limited thereto. Various changes or modifications may be made to the embodiment without departing from the scope and spirit of the disclosure.

What is claimed is:

1. A coating apparatus, comprising:
    a housing defining a receiving space;
    a sputter mechanism facing a through hole;
    an evaporation mechanism facing the through hole; and
    a workpiece transport assembly comprising a fixing plate having the through hole, a first transport member, a first shaft, a second transport member, and a second shaft, wherein the fixing plate is secured to the housing and divides the receiving space into a sputter chamber and an evaporation chamber, the sputter mechanism is mounted in the sputter chamber, and the evaporation mechanism is mounted in the evaporation chamber, the sputter chamber communicates with the evaporation chamber via the through hole, the first transport member is configured to transport at least one workpiece between a first position and a second position, and the first shaft is secured to the first transport member and rotatably mounted to the fixing plate, the first shaft configured to rotate the first transport member containing the at least one workpiece to the first position to be coated by both the sputter mechanism and the evaporation mechanism via the through hole and move the first transport member containing the at least one workpiece to the second position to be coated by only the sputter mechanism or only the evaporation mechanism, the second transport member is configured to transport at least one workpiece between a first position and a second position, and the second shaft is secured to the second transport member and rotatably mounted to the fixing plate, the second shaft configured to rotate the second transport member containing the at least one workpiece to the first position to be coated by both the sputter mechanism and the evaporation mechanism via the through hole and move the first transport member containing the at least one workpiece to the second position to be coated by only the sputter mechanism or only the evaporation mechanism.

2. The coating apparatus as described in claim 1, wherein at least one end of the first shaft is operable to be rotated from outside the housing.

3. The coating apparatus as described in claim 1, wherein the first transport member and the first shaft are in the sputter chamber.

4. The coating apparatus as described in claim 1, wherein the first transport member and the first shaft are in the evaporation chamber.

5. The coating apparatus as described in claim 1, wherein at least one end of the second shaft is operable to be rotated from outside the housing.

6. The coating apparatus as described in claim 1, wherein the second transport chamber and the second shaft are in the sputter chamber.

7. The coating apparatus as described in claim 1, wherein the second transport chamber and the second shaft are in the evaporation chamber.

8. The coating apparatus as described in claim 1, wherein the housing comprise a top plate and a bottom plate opposite to the top plate, the sputter mechanism is secured to the top plate, and the evaporation mechanism is secured to the bottom plate.

9. The coating apparatus as described in claim 1, wherein the sputter mechanism and the evaporation mechanism face the through hole.

10. The coating apparatus as described in claim 1, wherein the evaporation mechanism comprises an evaporation pot, a first fixing member, and a second fixing member, the evaporation pot is configured to receive coating material, the evaporation pot is mounted on the first fixing member, the first fixing member engages with the second fixing member, the second fixing member is secured to the housing, the second fixing member defines a receiving hole communicating with the evaporation chamber, and the evaporation pot is received in the receiving hole.

11. The coating apparatus as described in claim 10, wherein the evaporation mechanism further comprises a hollow sprayer secured to the second fixing member and received in the evaporation chamber, the sprayer defines an opening, the evaporation chamber communicates with the opening and the receiving hole.

12. The coating apparatus as described in claim 10, wherein the evaporation mechanism is frustum shaped.

* * * * *